United States Patent [19]

Krakovyak

[11] Patent Number: 5,793,668
[45] Date of Patent: Aug. 11, 1998

[54] METHOD AND APPARATUS FOR USING PARASITIC CAPACITANCES OF A PRINTED CIRCUIT BOARD AS A TEMPORARY DATA STORAGE MEDIUM WORKING WITH A REMOTE DEVICE

[75] Inventor: Michael Krakovyak, East Hanover, N.J.

[73] Assignee: Timeplex, Inc., Woodcliff Lake, N.J.

[21] Appl. No.: 870,820

[22] Filed: Jun. 6, 1997

[51] Int. Cl.$^6$ .................................................. H01L 23/48
[52] U.S. Cl. .......................... 365/149; 257/690; 257/692; 257/784
[58] Field of Search ....................... 365/189.01, 149; 257/690, 692, 784

[56] References Cited

U.S. PATENT DOCUMENTS

| | | | |
|---|---|---|---|
| 3,593,037 | 7/1971 | Hoff, Jr. | 307/238 |
| 3,665,210 | 5/1972 | Ho et al. | 307/238 |
| 3,676,863 | 7/1972 | Ho | 340/173 CA |
| 3,697,962 | 10/1972 | Beausoleil et al. | 340/173 R |
| 3,949,382 | 4/1976 | Yasui | 340/173 R |
| 3,997,881 | 12/1976 | Hoffmann | 340/173 R |
| 4,044,342 | 8/1977 | Suzuki | 340/173 DR |
| 4,442,509 | 4/1984 | Herndon | 365/154 |
| 4,670,666 | 6/1987 | Yoshida | 307/246 |
| 4,780,852 | 10/1988 | Kajigaya et al. | 365/203 |
| 4,893,277 | 1/1990 | Kajigaya et al. | 365/203 |
| 5,337,271 | 8/1994 | Kawahara et al. | 365/149 |
| 5,390,141 | 2/1995 | Cohen et al. | 365/96 |
| 5,525,834 | 6/1996 | Fischer et al. | 257/691 |
| 5,629,838 | 5/1997 | Knight et al. | 361/782 |
| 5,640,045 | 6/1997 | Krausse | 257/705 |
| 5,701,032 | 12/1997 | Fischer et al. | 257/692 |

*Primary Examiner*—Viet Q. Nguyen
*Attorney, Agent, or Firm*—Irwin Ostroff; Erwin Pfeifle

[57] ABSTRACT

An apparatus uses parasitic capacitances between each of one or more leads and a spaced apart electrically conductive plane on a Printed Circuit Board (PCB) to store data transmitted on the one or more leads until new data is transmitted over the one or more leads from first or second devices interconnected by the one or more leads. The first device is responsive to a first control signal for modifying the data on the one or more leads and transmitting the modified data back onto the one or more leads. Alternatively, the first device is responsive to a second control signal for inhibiting the first device from reading the data from the one or more leads and from transmitting any data back onto the one or more leads for at least one clock cycle. When the first device is responsive to the second control signal, the data stored in the parasitic capacitances are, for example, read back into the second device and/or used as an output of the apparatus during a predetermined time period.

19 Claims, 3 Drawing Sheets

METHOD AND APPARATUS FOR USING PARASITIC CAPACITANCES OF A PRINTED CIRCUIT BOARD AS A TEMPORARY DATA STORAGE MEDIUM WORKING WITH A REMOTE DEVICE

FIELD OF THE INVENTION

The present invention relates to method and apparatus for storing information over at least one clock cycle using parasitic capacitances of a Printed Circuit Board while selectively inhibiting a remote circuit or device from overwriting the information during a predetermined period of the at least one clock cycle.

BACKGROUND OF THE INVENTION

Computer systems used for various purposes such as in communication systems can temporarily store instructions or information in memory cells of Random Access Memory (RAM) chips. So-called static RAM chips store bits of data as long as current flows through the circuit, whereas Dynamic RAM (DRAM) chips need refresh signals applied to the memory cells at regular intervals of, for example, a few milliseconds to retain the information stored in the memory cells.

Parasitic capacitances contained with circuits of a given integrated circuit chip have also been used for data storage purposes in semiconductor memories and in shift registers. In this regard see, for example, U.S. Pat. No. 4,442,509 (Herndon), issued on Apr. 10, 1984, and U.S. Pat. No. 3,665,210 (Ho et al.), issued on May 23, 1972.

U.S. Pat. No. 4,670,666 (Yoshida), issued on Jun. 2, 1987, discloses an MOS transistor circuit for shared precharging of bus lines using parasitic capacitances. The MOS transistor circuit precharges parasitic capacitances associated with a plurality of parallel data transfer lines under the control of a clock signal. Each bus line is pulled up to a "High" or "1" logic state through associated first MOS transistors, and only selected bus lines are thereafter pulled down to a "Low" or "0" logic state pursuant to a bit transfer operation. The circuit is also provided with a series of second MOS transistors coupled across adjacent bus lines such that the precharging of the discharged bus lines is contributed to by charging paths associated with non-discharged lines. This is said to shorten the overall precharging time and equalize the charge potentials.

Electrically Programmable Logic Devices (EPLDs) are devices which comprise many gates and are digital, user-configurable integrated circuits (ICs), that are used to implement custom logic functions. In accordance with predetermined instructions, the EPLD modifies or does not modify the received data and retransmits that modified or unmodified data back to a device as, for example, a RAM for storage in the address location from which the original data came. To not modify received data and then transmit the unmodified data back to the RAM requires numerous gates and circuits in the EPLD.

It is desirable to provide method and apparatus that avoids the need for a circuit like an EPLD on a Printed Circuit Board (PCB) to require many gates and circuits just to send information back in an unmodified form to a second circuit such as a memory (e.g., a RAM) from where it was originally sent, or to an output of the apparatus.

SUMMARY OF THE INVENTION

The present invention is directed to method and apparatus that permits a circuit mounted on a Printed Circuit Board (PCB), like an Electrically Programmable Logic Device (EPLD), to selectively inhibit the reception of data from a memory or other circuit and sending of any data back to the memory or other circuit when the data from the memory is not to be modified by the EPLD, thereby saving the need for many gates and circuits in the EPLD for retransmitting any unmodified data. Instead, the data from the memory is stored in parasitic capacitances associated with leads that the data is sent over on the PCB, and used for reading the unchanged or unmodified data back into the memory when the EPLD is selectively inhibited from receiving the data present on the leads.

Viewed from one aspect, the present invention is directed to apparatus comprising a printed circuit board (PCB) and a processing device. The printed circuit board (PCB) comprises at least one lead and an electrically conductive layer separated by a dielectric layer which forms a separate parasitic capacitance between each at least one lead and the electrically conductive layer. The parasitic capacitance stores a value of a data signal propagating on the at least one lead for a predetermined period of time. The processing device is coupled to the at least one lead and is responsive to (a) a first control signal for modifying the data signal received on the at least one lead and transmitting the modified data signal back over the at least one lead, and (b) a second control signal for inhibiting both a reception of the data signal from the at least one lead and a transmission of any data signal back onto the at least one lead. When the processing device is responsive to the second control signal, the data signal stored in the parasitic capacitance is used as an unmodified output signal from the processing device.

Viewed from another aspect, the present invention is directed to apparatus comprising a printed circuit board (PCB), a first device, and a second device. The PCB comprises at least one lead and an electrically conductive layer separated by a dielectric layer which forms a separate parasitic capacitance between each at least one lead and the electrically conductive layer. The parasitic capacitance stores a value of a data signal propagating on the at least one lead for a predetermined period of time. The first device is coupled to the at least one lead for transmitting data signals to, and receiving data signals from, the at least one lead. The second device is coupled to the at least one lead and is responsive to (a) a first control signal for modifying the data signal received on the at least one lead and transmitting the modified data signal back over the at least one lead, and (b) a second control signal for inhibiting both a reception of the data signal from the at least one lead and a transmission of any data signal back onto the at least one lead. When the second device is responsive to the second control signal, the data signal stored in the parasitic capacitance is used as an unmodified output signal from the second device.

Viewed from still another aspect, the present invention is directed to a method of transmitting data between first and second devices on a Printed Circuit Board (PCB) comprising at least one lead coupling the first and second devices and a spaced apart electrically conductive layer. In a first step of the method, a data signal is transmitted by the first device over the at least one lead. In a second step, the data signal is stored in a parasitic capacitance formed by the at least one lead and the electrically conductive layer until a next data signal is transmitted over the at least one lead. In a third step, the data signal is received from the at least one lead into the second device in response to a first control signal to the second device, the data signal is modified, and the modified data signal is transmitted onto the at least one lead. Alternatively, the second device is inhibited both from receiving the data signal from the at least one lead, and from transmitting any data signal back onto the at least one lead by the second device in response to a second control signal to the second device. In a fourth step, any one of the first device or a third device has applied thereto either the modified data signal output from the second device transmitted onto the at least one lead when the second device is responsive to the first control signal in the third step, or the data signal that is stored in the parasitic capacitance associated with the at least one lead when the second device is responsive to the second control signal in the third step.

The invention will be better understood from the following more detailed description taken with the accompanying drawings and claims.

The drawings are not necessarily to scale.

DETAILED DESCRIPTION

It is to be understood that corresponding elements performing the same function in the several views of the drawings are provided with the same designation numbers.

Figure 1:
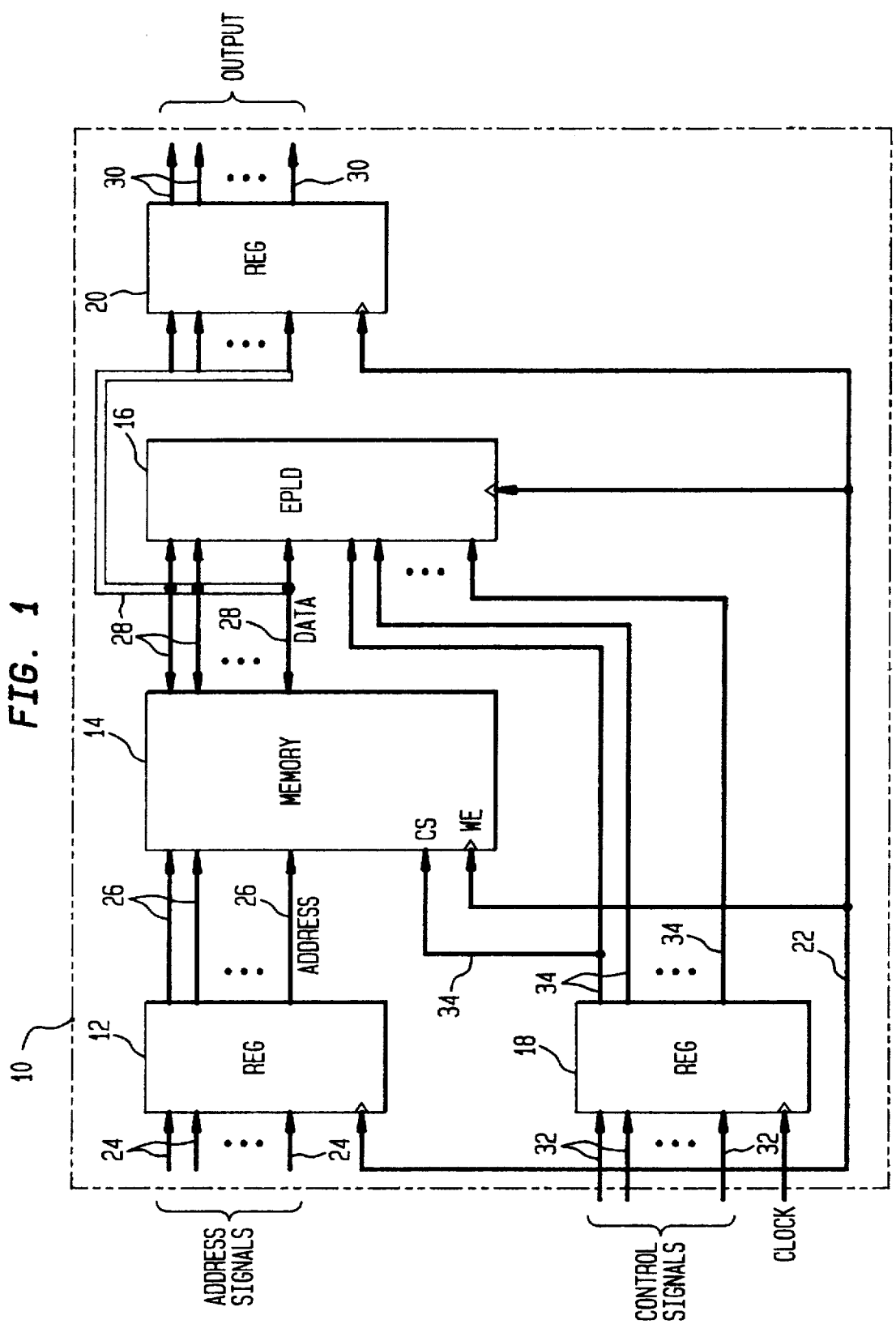
FIG. 1 is a schematic diagram comprising circuitry mounted on a Printed Circuit Board for, in part, providing a Random Access Memory in accordance with the present invention.

Referring now to FIG. 1, there is shown a schematic diagram comprising exemplary circuitry mounted on a Printed Circuit Board (PCB) 10 in accordance with the present invention. More particularly, the PCB 10 is shown as comprising a first register (REG.) 12, a memory 14, an Electrically Programmable Logic Device (EPLD) 16, a second register (REG.) 18, and a third register (REG.) 20. The first register 12 is arranged to receive address signals from one or more remote devices (not shown) via leads 24. Outputs of the first register 12 are coupled to the memory 14 via leads 26 for transmitting predetermined address signals to the memory 14. The memory 14 and the EPLD 16 are coupled for bidirectional communication via leads 28, with leads 28 also being coupled to inputs of the third register 20. Outputs from the third register 20 are coupled to a remote device (not shown) via leads 30. The second register 18 receives control signals via leads 32, and transmits control signals to the EPLD 16 via leads 34, where one of leads 34 provides a "chip select" (CS) signal as an input to the memory 14. A clock signal on a lead 22 is provided to an input of each of the first register 12, the memory 14, the EPLD 16, the second register 18, and the third register 20.

Figure 2:
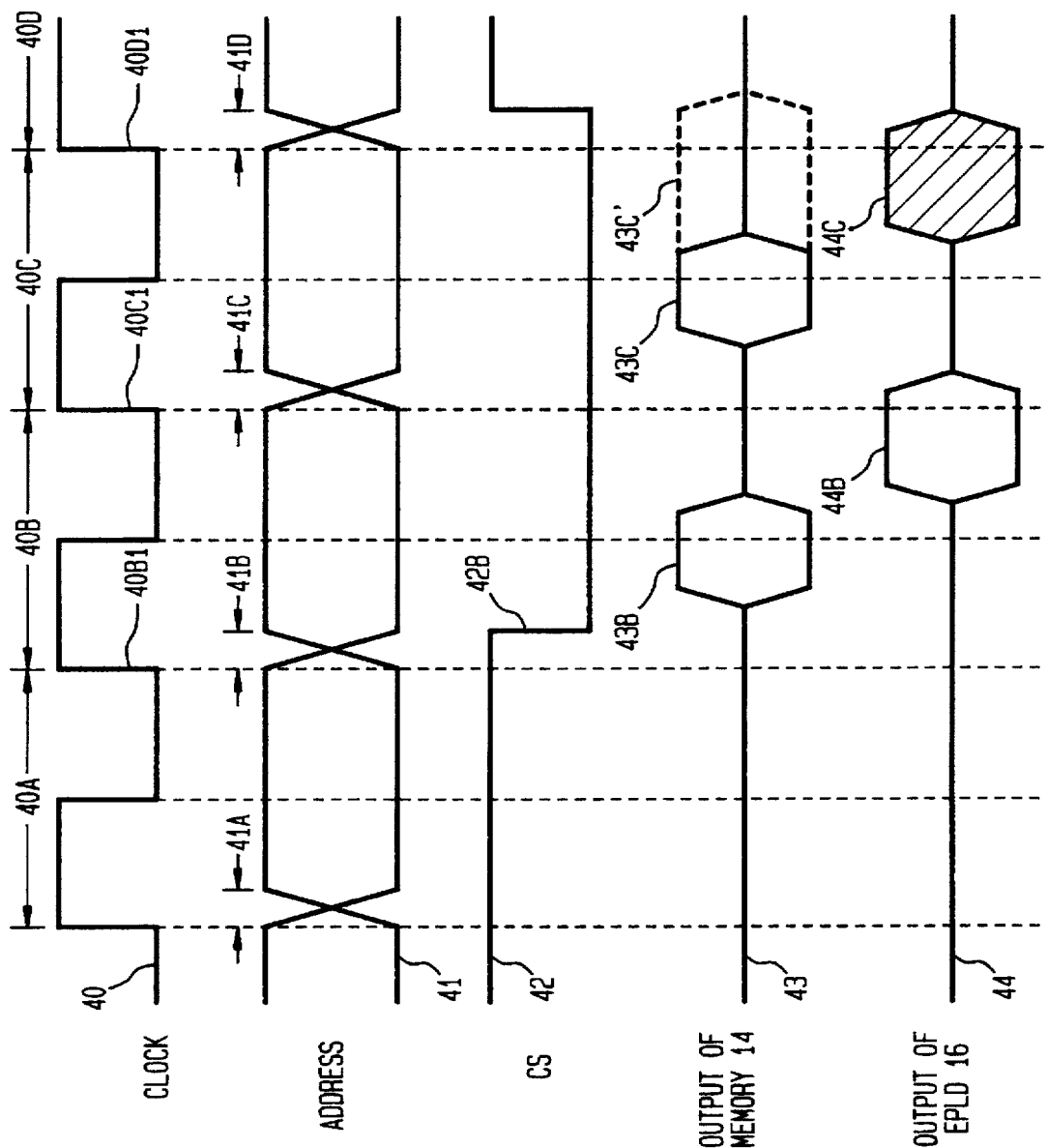
FIG. 2 is a timing and signal flow diagram of signals between selective circuitry shown in FIG. 1 in accordance with the present invention.

Referring now to FIG. 2, there is shown exemplary timing and signal flow diagrams depicting a clock signal waveform 40, an address signal timing diagram 41, a Chip Select (CS) waveform 42, a timing diagram 43 for outputs of the memory 14, and a timing diagram 44 for outputs from the EPLD 16 shown in FIG. 1 in accordance with the present invention. The sequence of the various waveforms and timing diagrams will be discussed hereinafter relative to FIGS. 1, 2, and 3 for the operation of the present invention.

Figure 3:
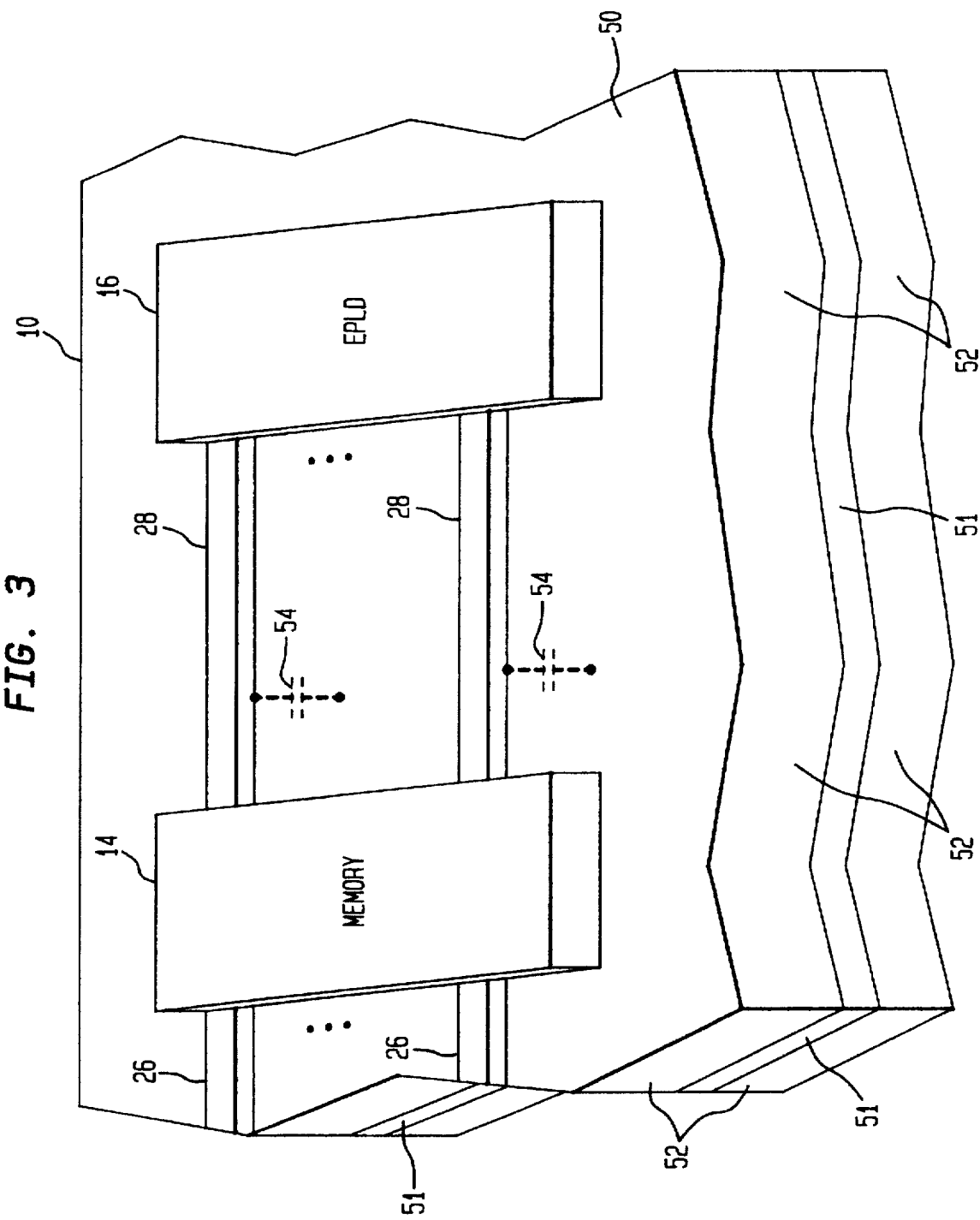
FIG. 3 is an enlarged perspective view of a portion of the circuitry and Printed Circuit Board of FIG. 1 in accordance with the present invention.

Referring now to FIG. 3, there is shown an enlarged perspective view of a portion of the Printed Circuit Board (PCB) 10 of FIG. 1, the memory 14, the Electrically Programmable Logic Device (EPLD) 16, and the electrical leads 26 and 28 associated therewith in accordance with the present invention. More particularly, the PCB 10 comprises a major surface 50 on which the memory 14 and the EPLD 16 are mounted, and on which the leads 26 and 28 are formed. Still further, the PCB 10 is a multilayer board comprising a ground plane 51 and other layers (not shown) which are separated by epoxy or other suitable dielectric layers 52. When data signals are sent on leads 28 between the memory 14 and the EPLD 16, parasitic capacitances 54 (shown by dashed lines) between the leads 28 and the ground plane 51 are able to store the information for a predetermined time period which is longer than a clock cycle in accordance with the present invention.

In operation, sequential address signals 41A, 41B, 41C, and 41D (shown in FIG. 2) are received by the first register 12 via leads 24 and are saved therein for the duration of a clock cycle 40A, 40B, 40C, and 40D, respectively. More particularly, each address signal 40A, 40B, 40C, and 40D is received and read into the first register 12 starting at the rise time of the clock cycle 40A, 40B, 40C, and 40D, respectively, and outputted (written out) onto leads 26 starting at the down time (low period) of the respective clock cycle 40A, 40B, 40C, and 40D. For purposes of example only hereinafter, it is assumed that each clock cycle 40A, 40B, 40C, 40D, etc. (from one rise time to the next rise time) has a duration of, for example, 50 nanoseconds.

Concurrent therewith, the second register 18 receives control signals (not shown in FIG. 2 except for the CS signal) via leads 32 during each of the clock cycles 40A, 40B, 40C, and 40D, saves the control signals for one clock cycle, and outputs the control signals via leads 34 to the memory 14 and the EPLD 16.

The memory 14 receives the clock signal 40 via lead 22, the address 41 from the first register 12 via leads 26, and the CS control signal 42 from the second register 18 via lead 34. In response to these input signals, the memory 14 outputs information stored at the designated received address via leads 28 during a high period (read cycle) of each of the clock cycles 40A, 40B, 40C, and 40D. More particularly, in cycle 40B of the clock signal shown in FIG. 2, an address (X) along with a high CS control signal are concurrently presented to the memory 14. The CS control signal is used to identify the memory chip to which the address is to be used where the memory 14 comprises more than one memory chip. It is to be assumed hereinafter that the memory 14 comprises first and second memory chips where a high CS signal indicates, for example, the first memory chip and a low CS signal indicates the second memory chip. After the address 41B and the CS signal 42B are concurrently presented to the memory 14, then depending on the speed of the memory 14 (e.g., 10 nanoseconds), the data is output from the memory 14 during a time period 43B on leads 28 until the clock signal in cycle 40B goes from a high condition (read cycle) to a low condition (write cycle). At the transition of the high to the low condition of the clock signal, the memory 14 changes from the read cycle to the write cycle and thereby stops driving the output from the memory 14. A slight delay time (e.g., 6 nanoseconds) causes the output 43B of the memory 14 to overlap into the write cycle.

It is assumed hereinafter that during clock cycle 40B the control signals on leads 34 inform the EPLD 16 to modify the data outputted by the memory 14, and that during clock cycle 40C the control signals on leads 34 inform the EPLD 16 that the data outputted by the memory 14 is not to be modified. The EPLD 16 reads the data presented on leads 28 (not shown in FIG. 2) on the falling edge of the clock cycle 40B and latches this data into internal registers (not shown) of the EPLD 16. It should be noted that the data on leads 28 is also available to the third register 20 but is not read into the third register 20 because the third register 20 only reads data present on leads 28 during a rise time of a clock cycle. The EPLD 16 is responsive to the control signals on leads 34 to selectively modify or not modify the data on leads 28 depending on what is indicated in the control signals. When the data on leads 28 is to be modified, the EPLD 16 modifies the data and transmits it back via leads 28 towards the memory 14 during the time period 44B shown in FIG. 2. The memory 14 writes this modified data from the EPLD 16 on leads 28 into the address location from which the data originally was transmitted during the low portion of the clock cycle 40B of the time period 43B. Because of the delay time of the EPLD 16, the modified data on leads 28 extends slightly into clock cycle 40C and is read into the third register 20 during the rise time of clock cycle 40C. It is to be understood that the EPLD 16 can comprise any suitable device such as an EPLD obtainable from the Altera Company of San Jose, Calif.

Clock cycle 40C illustrates a timing of signals in accordance with the present invention. As is found in all other clock cycles, during the rise time of the clock cycle 40C the address 41C and the CS signals cause data to be transmitted by the memory 14 on leads 28 as is shown by the solid-lined portion 43C. In contrast with what is shown and described hereinabove for clock cycle 40B, the control signals (not shown) received by the EPLD 16 on leads 34 during clock cycle 40C indicate that the data presented on leads 28 is not to be modified by the EPLD 16. Under this condition, the EPLD 16 is inhibited from reading or operating on the data presented on leads 28 and sending any data back onto leads 28. The hatched area 44C in FIG. 2 is meant to indicate that where data is normally output from the EPLD 16, the EPLD 16 is "tristated" which turns the EPLD 16 into a high impedance and results in no data being driven from the EPLD 16 onto the leads 28.

The presence of the originally sent data from the memory 14 on each of the leads 28 is temporarily stored in a separate parasitic capacitances 54 (shown in FIG. 3) formed between each of the leads 28 and the ground plane 51. This data remains stored in the parasitic capacitances 54 for more than a clock cycle or until other data is written onto the leads 28 from the memory 14 or the EPLD 16. Therefore, when the data is originally transmitted by the memory 14 during the period 43C (shown in FIG. 2), and the EPLD 16 is inhibited from transmitting data back to the memory 14 during the period 44C shown in FIG. 2, the data stored in the parasitic capacitances 54 is written back into the memory 14 during the low portion of the clock cycle 40C and into the third register 20 during the rise time 40D1 of the clock cycle 40D. The data from memory 14 is stored in the parasitic capacitances 54 during the time period 43C and the dashed portion 43C' shown for the output of the memory 14 in FIG. 2, and remains until data is transmitted from the memory 14 on leads 28 during the next clock cycle 40D.

Therefore, in accordance with the present invention, data is transmitted from the memory 14, or a first device, during a first predetermined time period of a clock cycle onto leads 28 to the EPLD 16, or a second device, and stored in parasitic capacitances 54 formed by layers of the PCB 10. The data is only read from the leads 28 into the EPLD 16 when the data is to be modified by the EPLD 16. When the data on leads 28 is not to be modified by the EPLD 16, the EPLD 16 is inhibited from reading the data on leads 28 and outputting any data to the leads 28. The modified data generated by the EPLD 16, or the stored data in the parasitic capacitances 54 when the EPLD 16 does not modify the data, is read back into the memory 14 and output to other devices during a second predetermined time period of the clock cycle. Although the EPLD 16 only handles one set of data from the leads 28 at a time, the prior art EPLDs normally required a certain amount of logic to do nothing to the data and then drive it back to the memory 14 in the same way that it was received by the EPLD 16. Therefore, the main advantage of the present invention is that gates and devices normally needed in the EPLD 16 to not modify the data found on leads 28 and to drive the unmodified data back onto the leads 28 to the memory 14 are no longer required. This allows EPLD 16 to have a simpler design than prior art EPLDS, and thus there is an economic savings.

It is to be appreciated and understood that the specific embodiments of the invention described hereinabove are merely illustrative of the general principles of the invention. Various modifications may be made by those skilled in the art which are consistent with the principles set forth. For example, the sequence of events shown in FIG. 2 need not be precisely as shown, and the concept of the present invention of storing data in parasitic capacitances 54 of a PCB 10 while inhibiting any device (e.g., EPLD 16) from receiving and acting on the data can be used in other arrangements.

What is claimed is:

1. An apparatus comprising:
   a printed circuit board (PCB) comprising at least one lead and an electrically conductive layer separated by a dielectric layer which forms a separate parasitic capacitance between each at least one lead and the electrically conductive layer, the parasitic capacitance being able to store a value of a data signal propagating on the at least one lead for a predetermined period of time; and
   a processing device is coupled to the at least one lead and is responsive to (a) a first control signal for modifying the data signal received on the at least one lead and transmitting the modified data signal back over the at least one lead, and (b) a second control signal for inhibiting both the reception of the data signal from the at least one lead and a transmission of an any data signal back onto the at least one lead so that the data signal stored in the parasitic capacitance is used as an unmodified output signal from the processing device.

2. The apparatus of claim 1 further comprising a second device which transmits the data signal onto the at least one lead towards the processing device during a first time period of a first clock cycle.

3. The apparatus of claim 2 wherein the data signal is stored in the parasitic capacitance until a second data signal is transmitted over the at least one lead by any one of the processing and second devices.

4. The apparatus of claim 3 wherein when the processing device is responsive to the second control signal, the data stored in the parasitic capacitance is used as an output of the apparatus and/or by the second device.

5. The apparatus of claim 2 wherein the second device is a memory that reads the data present on the at least one lead from any one of the processing device or the parasitic capacitance during a second period of the first clock cycle and stored the data in a predetermined memory location.

6. The apparatus of claim 5 wherein the memory is responsive to a third control signal at the beginning of a clock cycle indicating a predetermined address location in the memory for transmitting the information stored at the address location on the at least one lead towards the processing device.

7. The apparatus of claim 2 wherein in response to a predetermined third control signal at the beginning of any clock cycle, the second device is enabled for transmitting predetermined data over the at least one lead towards the processing device which remains present on the at least one lead due the charge formed on the parasitic capacitance until a second data signal is transmitted over the at least one lead by any one of the processing device in response to the first control signal or the second device in response to a next predetermined third control signal.

8. The apparatus of claim 1 wherein the processing device is an electrically programmable logic device.

9. An apparatus comprising:
- a printed circuit board (PCB) comprising at least one lead and an electrically conductive layer separated by a dielectric layer which forms a separate parasitic capacitance between each at least one lead and the electrically conductive layer, the parasitic capacitance being able to store a value of a data signal propagating on the at least one lead for a predetermined period of time;
- a first device coupled to the at least one lead for transmitting data signals to, and receiving data signals from, the at least one lead; and
- a second device coupled to the at least one lead which is responsive to (a) a first control signal for modifying the data signal received on the at least one lead and transmitting the modified data signal back over the at least one lead, and (b) a second control signal for inhibiting both the reception of the data signal from the at least one lead and a transmission of any data signal back onto the at least one lead so that the data signal stored in the parasitic capacitance is used as an unmodified output signal from the processing device.

10. The apparatus of claim 9 wherein the first device is a memory which transmits the data signal onto the at least one lead towards the second device during a first time period of a first clock cycle.

11. The apparatus of claim 10 wherein the data signal is stored in the parasitic capacitance until a second data signal is transmitted over the at least one lead by any one of the first and second devices.

12. The apparatus of claim 11 wherein when the second device is responsive to the second control signal, the data stored in the parasitic capacitance is used as an output of the apparatus and by the first device.

13. The apparatus of claim 10 wherein the first device reads the data present on the at least one lead from any one of the second device or the parasitic capacitance during a second period of the first clock cycle and stores the data in a predetermined memory location.

14. The apparatus of claim 13 wherein the first device is responsive to a third control signal at the beginning of a clock cycle indicating a predetermined address location in the memory for transmitting the information stored at the address location on the at least one lead towards the second device.

15. The apparatus of claim 10 wherein in response to a predetermined third control signal at the beginning of any clock cycle, the first device is enabled for transmitting predetermined data over the at least one lead towards the second device which remains present on the at least one lead due to the charge formed on the parasitic capacitance until a second data signal is transmitted over the at least one lead by any one of the first device in response to a next predetermined third control signal or the second device in response to the first control signal.

16. The apparatus of claim 1 wherein the processing device is an electrically programmable logic device.

17. A method of transmitting data between a first and a second device on a Printed Circuit Board (PCB) comprising at least one lead coupling the first and second devices and a spaced apart electrically conductive layer, the method comprising the steps of:
- (a) transmitting a data signal by the first device over the at least one lead;
- (b) storing the data signal in a parasitic capacitance formed by the at least one lead and the electrically conductive layer until a next data signal is transmitted over the at least one lead;
- (c) receiving the data signal from the at least one lead into the second device in response to a first control signal to the second device, modifying the data signal, and transmitting the modified data signal onto the at least one lead, and inhibiting both the receiving of the data signal from the at least one lead into the second device and a transmission of any data signal back onto the at least one lead by the second device in response to a second control signal to the second device; and
- (d) applying to any one of the first device or a third device the modified data signal output from the second device onto the at least one lead when the second device is responsive to the first control signal in step (c), and the data signal that is stored in the parasitic capacitance associated with the at least one lead when the second device is responsive to the second control signal in step (c).

18. The method of claim 17 wherein steps (a) and (b) are performed during a first period of a clock cycle, step (c) is performed during a second period of a clock cycle, and step (d) is performed during a third period of a clock cycle or at the beginning of a next second clock cycle.

19. The method of claim 17 wherein the first device is a memory and the second device is an electrically programmable logic device.

* * * * *